United States Patent [19]
McClure

[11] Patent Number: 5,428,311
[45] Date of Patent: Jun. 27, 1995

[54] FUSE CIRCUITRY TO CONTROL THE PROPAGATION DELAY OF AN IC

[75] Inventor: David C. McClure, Carrollton, Tex.

[73] Assignee: SGS-Thomson Microelectronics, Inc., Carrollton, Tex.

[21] Appl. No.: 85,580

[22] Filed: Jun. 30, 1993

[51] Int. Cl.⁶ .......................................... H03K 17/284
[52] U.S. Cl. .................................... 327/276; 327/525; 326/83
[58] Field of Search ............... 307/443, 465, 480, 451, 307/591, 603, 202.1

[56] References Cited

U.S. PATENT DOCUMENTS

| | | | |
|---|---|---|---|
| 4,931,668 | 6/1990 | Kikuda et al. | 307/443 |
| 5,034,629 | 7/1991 | Kinugasa et al. | 307/451 |
| 5,099,148 | 3/1992 | McClure et al. | 307/443 |
| 5,111,076 | 5/1992 | Tarng | 307/443 |
| 5,118,971 | 6/1992 | Schenck | 307/465 |
| 5,218,239 | 6/1993 | Boomer | 307/443 |
| 5,254,883 | 10/1993 | Horowitz et al. | 307/443 |

Primary Examiner—Edward P. Westin
Assistant Examiner—Benjamin D. Driscoll
Attorney, Agent, or Firm—Renee M. Larson; Lisa K. Jorgenson; Richard K. Robinson

[57] ABSTRACT

According to the present invention, integrated circuitry provides for the ability to selectively introduce delays into the timing of the integrated circuit, without the expense and time associated with methods used in the prior art. As a minimum, a fuse element having at least one fuse and a transistor element having at least one transistor are placed in parallel to each other between a voltage supply of a gate of the integrated circuit and a corresponding voltage supply of the integrated circuit. When the fuse element is intact, the fuse element provides a relatively low resistance path from the voltage supply of the gate and the corresponding voltage supply of the integrated circuit. However, upon blowing the fuse element, this low resistance path is no longer available. An increased resistance path through the transistor element must be used, and the integrated circuit is slowed down accordingly. The amount of delay introduced to the delay element is a function of the values of the transistors in the transistor element.

6 Claims, 2 Drawing Sheets

FUSE CIRCUITRY TO CONTROL THE PROPAGATION DELAY OF AN IC

BACKGROUND OF THE INVENTION

1. Field of the Invention

The present invention relates generally to integrated circuit devices, and more specifically to a fused delay circuit for use in such integrated circuit devices.

2. Description of the Prior Art

Integrated circuits, especially high speed devices such as EPROMs, microprocessors, gate arrays, and memory devices, are optimally designed to operate as fast as possible. Devices which are marketed as slower version,,; of these high speed devices may or may not be slower, and often retain the high speed characteristics of the fastest device. For this reason, customers often purchase "slower" versions of a high speed device at a discount, and simply characterize and speed-sort the devices to determine which devices are actually "fast". Such an endeavor can be quite advantageous for the purchaser, due to the high premium price typically charged for the fastest speed grade part.

From an engineering perspective, devices branded as slow devices that are actually a fast speed grade can cause difficulties in the circuitry in which they are used. Often devices must meet the electrical parameters required by a slower application. For instance, timing problems can result when the proper hold time and set-up time for a device is not achieved.

To date, there have been few feasible methods available to effectively slow down integrated circuits. Mask changes may be used to slow down a fast device by adding additional logic gates or other circuitry to the mask set. Using this method, a new mask set is required for every speed grade of the device. Unfortunately, mask changes also require extensive design time and are therefore costly in terms of time and money expended. For these economical and engineering reasons, it would be desirable in the art to slow down the speed of an integrated circuit with a minimum amount of time, effort, and expense.

SUMMARY OF THE INVENTION

Therefore, according to the present invention, circuitry provides for the ability to selectively introduce delays into the timing of the integrated circuit, without the expense and time associated with methods used in the prior art. As a minimum, a fuse element having at least one fuse and a transistor element having at least one transistor are placed in parallel to each other between a voltage supply of a gate of the integrated circuit and a corresponding voltage supply of the integrated circuit. When the fuse element is intact, the fuse element provides a relatively low resistance path from the voltage supply of the gate to the corresponding voltage supply of the integrated circuit. However, upon blowing the fuse element, this low resistance path is no longer available. An increased resistance path through the transistor element must be used, and the integrated circuit is slowed down accordingly. The amount of delay introduced to the delay element is a function of the value chosen for the transistors in the transistor element.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

High speed integrated circuits, including EPROMs, microprocessors, gate arrays, and memory devices, are optimally designed to function as fast as possible. Because of economical and engineering reasons described in the Description of the Prior Art, it can be quite important to be able to slow down integrated circuits with an inexpensive and reliable means.

Figure 1A:
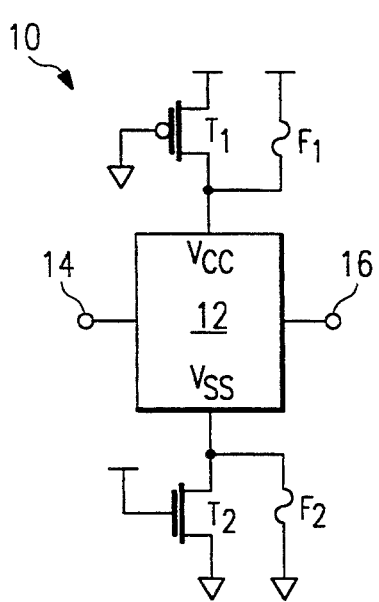
FIG. 1a is a gate block diagram for slowing an integrated circuit according to the present invention.

Referring to FIG. 1a, a gate block diagram 10 for slowing an integrated circuit is shown. Gate 12 can be any logic gate, including a NAND gate, a NOR gate, or an inverter, and has input signal 14 and output signal 16. Fuses $F_1$ or $F_2$ may be blown to slow down gate 12. The path to a supply voltage, either $V_{cc}$ or $V_{ss}$, has two paths in parallel, through either a fuse or a transistor. For instance, $V_{cc}$ of gate 12 has a path to the $V_{cc}$ supply voltage through fuse $F_1$ or through p-channel transistor $T_1$. Both fuse $F_1$ and transistor $T_1$ are chosen such that when fuse $F_1$ is intact, there is an effective short to the $V_{cc}$ supply voltage. When fuse $F_1$ is blown, gate 12 experiences an increased resistance to voltage supply $V_{cc}$ through p-channel transistor $T_1$. This increased resistance has the effect of slowing down the device. In a similar fashion, $V_{ss}$ of gate 12 has a path to the $V_{ss}$ supply voltage through fuse $F_2$ or n-channel transistor $T_2$. When fuse $F_2$ is blown, the resultant increased resistance through transistor $T_2$ slows the device.

Figure 1B:
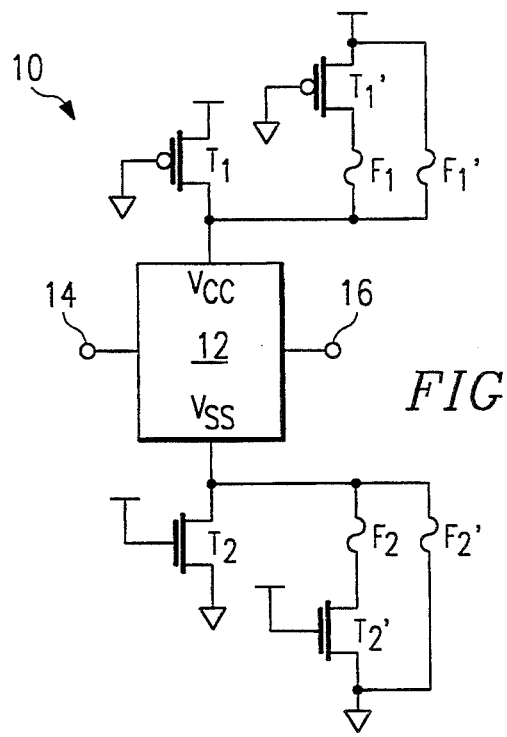
FIG. 1b is a gate block diagram with multiple delay elements for slowing an integrated circuit according to the present invention.

FIG. 1b shows a gate block diagram 10 for introducing different delay times to an integrated circuit. For slowing down the device in the $V_{cc}$ direction, two different delays may be introduced. First, when fuse $F_1'$ is blown, transistor $T_1$ is in parallel with $T_1'$ and a delay, which is dependent on the resistance value of transistor $T_1$ in parallel with transistor $T_1'$, is introduced to the device. Second, when both fuse $F_1$ and $F_1'$ are blown, a longer delay is introduced because the effective resistance is the resistance of $T_1$ itself. Therefore, adding a resistive element, in this case $T_1'$ in series with fuse $F_1$ and then placing a second fuse $F_1'$ in parallel with $F_1$ and $T_1'$ allows one of two delay times to be introduced to the device. More delay times may be realized by adding additional delay circuitry. In a similar fashion, for delay in the $V_{ss}$ direction, transistor $T_2'$ has been added in series with fuse $F_2$ and fuse $F_2'$ is placed in parallel to both $F_2$ and $T_2'$. Blowing fuse $F_2'$ introduces a delay which is a function of the resistance of $T_2$ in parallel with $T_2'$. A longer delay may be obtained by blowing both fuses $F_2$ and $F_2'$; the resultant delay is determined by the resistance of $T_2$. Although the resistive portion of the delay circuitry has been shown as transistors $T_1$, $T_1'$, $T_2$, and $T_2'$, resistors may be utilized in their place.

Figure 2:
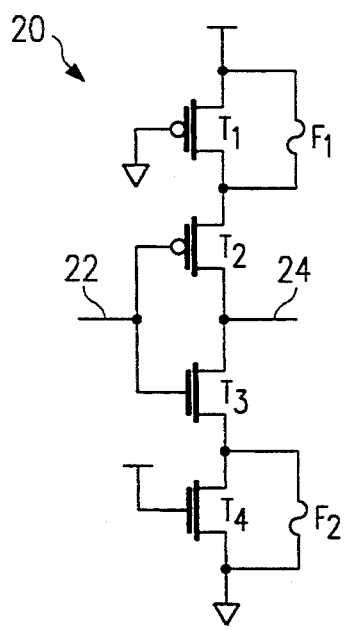
FIG. 2 is inverter circuitry for slowing an integrated circuit according to a first preferred embodiment of the present invention.

Referring to FIG. 2, inverter circuitry 20 for slowing an integrated circuit according to a first preferred embodiment of the present invention is shown. The gate 12 of FIG. 1a has been replaced by the inverter defined by p-channel transistor $T_2$ and n-channel transistor $T_3$. When fuses $F_1$ and $F_2$ are intact, transistors $T_2$ and $T_3$ behave as an inverter. Input signal 22 is inverted and passed through as output signal 24. Input signal 22 is analogous to input signal 14 of FIGS. 1a and 1b while output signal 24 is analogous to output signal 16 of FIGS. 1a and 1b.

Transistors $T_1$ and $T_4$ are small transistors; the ratio of width to length of these transistors is typically less than the width to length ratio of transistors $T_2$ and $T_3$. The values of transistors $T_1$ and $T_4$ are chosen such that when corresponding fuses $F_1$ or $F_2$, respectively, are blown, the resistance of the path of supply voltage $V_{cc}$ or $V_{ss}$, respectively, increases substantially, thereby slowing down the integrated circuit device. Typical values of the resistance of transistors $T_1$ and $T_4$ may be as much as ten times the value of the resistance of transistors $T_2$ and $T_3$. Since transistors $T_1$ and $T_4$ act as resistive elements, they may be replaced with high impedance resistors which may be formed in poly or active regions. Additional transistors and fuses may be added as shown in FIG. 1b to introduce delay times of differing duration.

Figure 3:
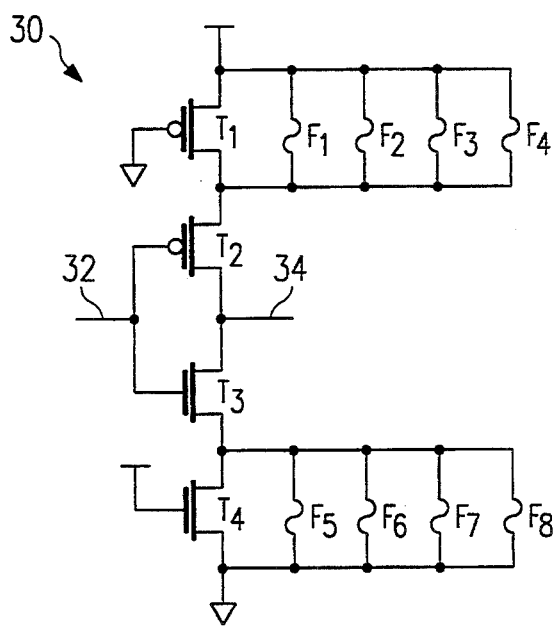
FIG. 3 is inverter circuitry for slowing an integrated circuit according to a second preferred embodiment of the present invention.

Referring to FIG. 3, inverter circuitry 30 for slowing an integrated circuit according to a second preferred embodiment of the present invention is shown; circuitry 30 reduces the circuitry resistance when the fuses are intact. Input signal 32 and output signal 34 are analogous to input signal 22 and output signal 24, respectively, of FIG. 2.

Placing fuses $F_1$, $F_2$, $F_3$, and $F_4$ in parallel to each other and to transistor $T_1$ as shown in FIG. 3 reduces the resistance they provide when they are intact. This is also true for fuses $F_5$, $F_6$, $F_7$, and $F_8$ which are parallel to each other and to transistor $T_4$. If the required delay need only be in one voltage direction, either $V_{cc}$ or $V_{ss}$, then only one of series transistors $T_1$ or $T_4$ provides a path to a supply voltage. In this case, only one of the transistors, $T_1$ or $T_4$, and its associated fuses would need to be layed out in the circuitry of the device. For instance, if a $V_{ss}$ delay is required, then fuses $F_5$, $F_6$, $F_7$, and $F_8$ are blown such that transistor $T_4$ provides a high resistance path to ground, thereby slowing down the device. The fuses of FIG. 3 may be placed in parallel with slew rate limiting resistors of the output driver (not shown) of circuitry 30 in order to adjust for noise levels. This may be accomplished by replacing transistors $T_1$ and $T_4$ with resistors $R_1$ and $R_4$.

Figure 4:
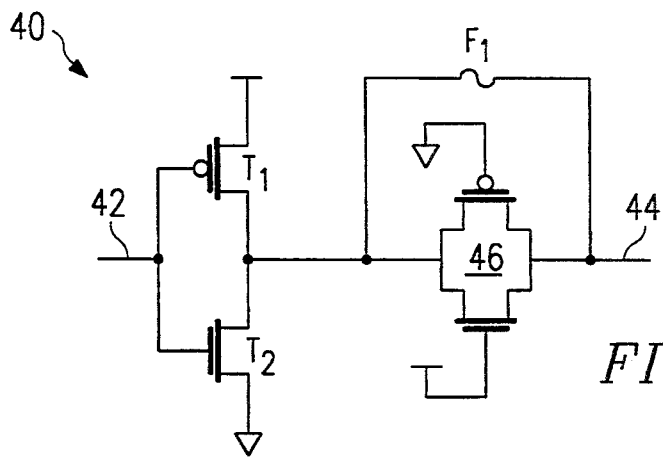
FIG. 4 is inverter circuitry having a pass gate for slowing an integrated circuit according to a third embodiment of the present invention.

Referring to FIG. 4, inverter circuitry 40, having a pass gate, for slowing an integrated circuit according to a third embodiment of the present invention is shown. Input signal 42 is connected to an inverter comprised of transistors $T_1$ and $T_2$. This circuitry uses less fuses than the circuitry of FIGS. 1, 2, and 3. Fuse $F_1$ is in series with pass gate 46 in the path of output signal 44. Although this configuration saves on the number of fuses used, the output signal 44 is loaded down when fuse $F_1$ is intact because of the diffusion capacitance of pass gate 46. The source and drain regions of pass gate 46 contribute extra capacitance when fuse $F_1$ is not blown. Poly resisters as well as active region resistors, however, could be used instead of pass gate 46 to fulfill the same resistance function.

Figure 5:
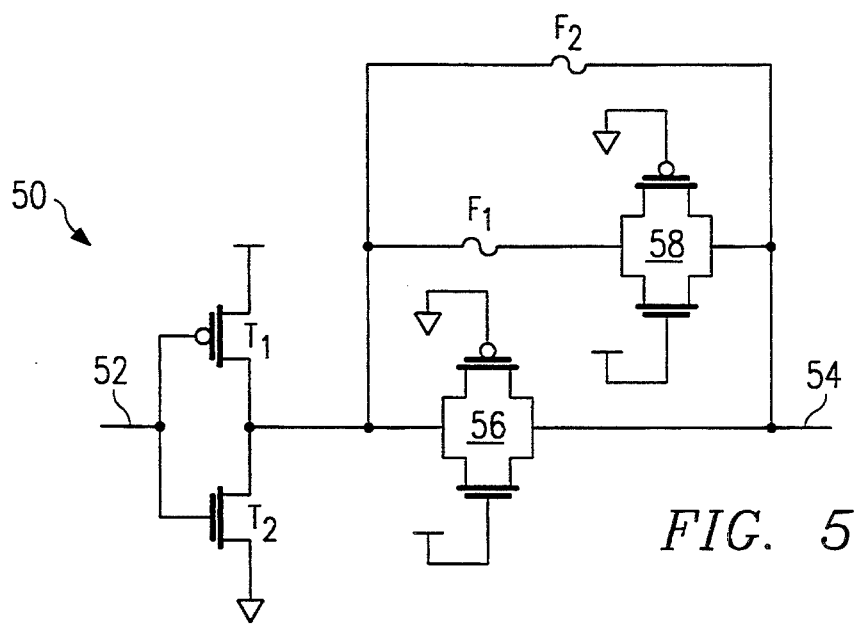
FIG. 5 is an inverter circuit according to a fourth embodiment of the present invention.

Additionally, as shown and described in conjunction with FIG. 1b, a resistive element, such as a second pass gate, could be placed in series with fuse $F_1$, and a second fuse placed in parallel to fuse $F_1$ and the second pass gate to allow for two different delays: a delay introduced by blowing the second fuse and a longer delay introduced by blowing both fuse $F_1$ and the second fuse. Referring to FIG. 5, such inverter circuitry 50 is shown. Input signal 52 is connected to an inverter comprised of transistors T1 and T2. Fuse $F_1$ is connected in series with pass gate 58 in the path of output signal 54. A second pass gate 58 is connected in series with fuse $F_1$, and a second fuse $F_2$ is placed in parallel to fuse $F_1$ and pass gate 58 such that two different delays maybe obtained: a delay by blowing fuse $F_2$ and a delay by blowing both fuse $F_1$ and fuse $F_2$.

While the invention has been particularly shown and described with reference to a preferred embodiment, it will be understood by those skilled in the .art that various changes in form and detail may be made therein without departing from the spirit and scope of the invention.

What is claimed is:

1. Circuitry for selectively introducing delays to an integrated circuit, comprising:
    a logic element having an input signal, an output signal, a first voltage supply input, and a second voltage supply input; and
    a delay element having a fuse element and a resistive element connected in parallel to each other with the resistive element connected in series with the output signal of the logic element, such that when the fuse element is blown, a delay time is introduced to the integrated circuit which is determined by the value of the resistive element.

2. The circuitry of claim 1, wherein the resistive element is a pass gate having a n-channel transistor with a source, a drain, and a gate, and a p-channel transistor with a source, a drain, and a gate, wherein the source of the n-channel transistor is connected to the source of the p-channel transistor, the drain of the n-channel transistor is connected to the drain of the p-channel transistors, the gate of the n-channel transistor is connected to a first power supply, and the gate of the p-channel transistor is connected to a second power supply.

3. The circuitry of claim 1, wherein the logic element is a logic gate.

4. The circuitry of claim 3, wherein the logic element is an inverter.

5. The circuitry of claim 1, wherein a longer delay time is obtained by increasing the resistance of the resistive element.

6. The circuitry of claim 5, wherein the fuse element comprises a first fuse and a second fuse, and the resistive element comprises a first pass gate and a second pass gate, and wherein the first fuse and the second pass gate are connected in series to each other and in parallel to the first pass gate, and the second fuse is also connected in parallel to the first pass gate, such that blowing the second fuse produces a first delay, and blowing the first fuse and the second fuse produces a second delay.

* * * * *